United States Patent
Ruby et al.

(10) Patent No.: US 10,177,735 B2
(45) Date of Patent: Jan. 8, 2019

(54) SURFACE ACOUSTIC WAVE (SAW) RESONATOR

(71) Applicant: Avago Technologies General IP (Singapore) Pte. Ltd., Singapore (SG)

(72) Inventors: Richard C. Ruby, Menlo Park, CA (US); Stephen Roy Gilbert, San Francisco, CA (US); John D. Larson, III, Palo Alto, CA (US)

(73) Assignee: Avago Technologies International Sales Pte. Limited, Singapore (SG)

(*) Notice: Subject to any disclaimer, the term of this patent is extended or adjusted under 35 U.S.C. 154(b) by 127 days.

(21) Appl. No.: 15/056,664

(22) Filed: Feb. 29, 2016

(65) Prior Publication Data
US 2017/0250673 A1    Aug. 31, 2017

(51) Int. Cl.
*H03H 9/64*   (2006.01)
*H03H 9/05*   (2006.01)
*H03H 9/02*   (2006.01)

(52) U.S. Cl.
CPC .... *H03H 9/02866* (2013.01); *H03H 9/02574* (2013.01); *H03H 9/02622* (2013.01); *H03H 9/64* (2013.01); *H03H 9/02559* (2013.01)

(58) Field of Classification Search
CPC .......... H03H 9/02543; H03H 9/02574; H03H 9/02614; H03H 9/02622; H03H 9/02653; H03H 9/02866; H03H 9/25; H03H 9/64; H03H 9/6496
USPC .................................. 333/193–195
See application file for complete search history.

(56) References Cited

U.S. PATENT DOCUMENTS

| | | | |
|---|---|---|---|
| 3,887,887 A | 6/1975 | Wagers et al. | |
| 4,144,117 A | 3/1979 | Fukuda et al. | |
| 4,163,201 A * | 7/1979 | Takahashi | H03H 9/02559 252/62.9 R |
| 4,388,600 A | 6/1983 | Wakino et al. | |
| 4,879,487 A | 11/1989 | Sugai | |
| 5,446,330 A | 8/1995 | Eda et al. | |
| 5,453,652 A * | 9/1995 | Eda | H03H 9/1092 310/313 R |
| 5,672,240 A * | 9/1997 | Stoner | H01L 21/2007 216/20 |
| 5,708,402 A | 1/1998 | Hachisu | |

(Continued)

FOREIGN PATENT DOCUMENTS

| | | |
|---|---|---|
| JP | 56-114423 A | 9/1981 |
| JP | 05-063500 * | 3/1993 |

(Continued)

OTHER PUBLICATIONS

English language machine translation of JP 2001-053579, published Feb. 23, 2001, 7 pages.*

(Continued)

*Primary Examiner* — Barbara Summons

(57) ABSTRACT

An apparatus includes a silicon (Si) substrate having a first surface and a second surface, the silicon substrate having a resistivity at room temperature greater than approximately 1000 Ω-cm, and less than approximately 15000 Ω-cm; and a piezoelectric layer disposed over the substrate and having a first surface and a second surface. The piezoelectric layer may have a thickness in the range of approximately 0.5 μm to approximately 30.0 μm, and is substantially without iron (Fe).

41 Claims, 6 Drawing Sheets

(56) References Cited

U.S. PATENT DOCUMENTS

| | | | |
|---|---|---|---|
| 6,060,818 | A | 5/2000 | Ruby et al. |
| 7,067,956 | B2 | 6/2006 | Imai et al. |
| 7,148,769 | B2 | 12/2006 | Takano |
| 7,213,314 | B2 | 5/2007 | Abbott et al. |
| 7,331,092 | B2 | 2/2008 | Miura |
| 7,501,912 | B2 | 3/2009 | Jamneala et al. |
| 7,504,759 | B2 * | 3/2009 | Sobu ............... H03H 3/08 310/313 R |
| 7,544,248 | B2 * | 6/2009 | Kajigaya ............. C30B 15/00 117/13 |
| 7,609,129 | B2 | 10/2009 | Yokota et al. |
| 7,675,387 | B2 * | 3/2010 | Sakiyama ........... H03H 9/02574 333/133 |
| 7,728,485 | B2 | 6/2010 | Handtmann et al. |
| 7,800,464 | B2 | 9/2010 | Tajima et al. |
| 7,939,987 | B1 | 5/2011 | Solal et al. |
| 8,035,464 | B1 | 10/2011 | Abbott et al. |
| 8,390,397 | B2 | 3/2013 | Jamneala et al. |
| 8,587,391 | B2 | 11/2013 | Gilbert et al. |
| 8,736,141 | B2 * | 5/2014 | Iwamoto ............. H01L 41/053 310/313 R |
| 8,866,365 | B2 * | 10/2014 | Hori ................. H03H 3/02 310/313 R |
| 8,907,547 | B2 * | 12/2014 | Tai .................. H01L 41/0838 310/313 R |
| 8,946,904 | B2 | 2/2015 | Railkar et al. |
| 8,997,320 | B2 | 4/2015 | Fuyutsume et al. |
| 9,243,316 | B2 | 1/2016 | Larson, III et al. |
| 9,391,666 | B1 | 7/2016 | Handtmann et al. |
| 2003/0022412 | A1 | 1/2003 | Higgins et al. |
| 2003/0199105 | A1 | 10/2003 | Kub |
| 2004/0226162 | A1 * | 11/2004 | Miura ................ H03H 3/08 29/594 |
| 2005/0088257 | A1 | 4/2005 | Ruby et al. |
| 2006/0043822 | A1 | 3/2006 | Yokota |
| 2006/0283375 | A1 * | 12/2006 | Kajigaya ............. C30B 15/00 117/13 |
| 2008/0024037 | A1 | 1/2008 | Tamura |
| 2008/0106354 | A1 | 5/2008 | Kando |
| 2014/0132117 | A1 | 5/2014 | Larson, III |
| 2014/0227434 | A1 | 8/2014 | Iwamoto |
| 2014/0320234 | A1 | 10/2014 | Takemura |
| 2015/0069882 | A1 | 3/2015 | Umeda et al. |
| 2015/0171823 | A1 | 6/2015 | Brawley |
| 2015/0244346 | A1 | 8/2015 | Feng et al. |
| 2017/0063330 | A1 | 3/2017 | Gilbert et al. |
| 2017/0063332 | A1 | 3/2017 | Gilbert et al. |
| 2017/0063338 | A1 | 3/2017 | Gilbert et al. |
| 2017/0063339 | A1 | 3/2017 | Burak et al. |
| 2017/0085247 | A1 | 3/2017 | Ruby et al. |
| 2017/0222619 | A1 * | 8/2017 | Iwamoto ............. H03H 9/0009 |
| 2017/0302251 | A1 | 10/2017 | Ruby et al. |

FOREIGN PATENT DOCUMENTS

| | | | | |
|---|---|---|---|---|
| JP | 05-283971 | A | | 10/1993 |
| JP | 10-126207 | | * | 5/1998 |
| JP | 10-163802 | | * | 6/1998 |
| JP | 11-092147 | | * | 4/1999 ............ C30B 33/00 |
| JP | 2000-278090 | A | | 10/2000 |
| JP | 2001-053579 | | * | 2/2001 |
| JP | 2002-330047 | A | | 11/2002 |
| JP | 2005-229455 | A | | 8/2005 |
| JP | 2005-347295 | | * | 12/2005 |
| JP | 4723207 | B2 | | 7/2011 |
| JP | 2012-015767 | A | | 1/2012 |
| JP | 2015-115870 | A | | 6/2015 |
| JP | 5814727 | B2 | | 11/2015 |
| WO | WO 2016/084526 | | * | 6/2016 |

OTHER PUBLICATIONS

English language machine translation of JP 2005-347295, published Dec. 15, 2005, 7 pages.*
English language machine translation of JP 05-063500, published Mar. 12, 1993, 3 pages.*
E.M. Standifer et al.; "Chemically Reduced Lithium Niobate Single Crystals: Processing, Properties and Improvements in SAW Device Fabrication and Performance"; 1998 IEEE International Frequency Control Symposium, 1998, pp. 470-472.*
Co-pending U.S. Appl. No. 14/835,679, filed Aug. 25, 2015.
Co-pending U.S. Appl. No. 14/866,394, filled Sep. 25, 2015.
Co-pending U.S. Appl. No. 15/009,801, filed Jan. 28, 2016.
Kochar, et al., "NSPUDT using C-Axis tilted ScAIN Thin Film", Frequency Control Symposium and the European Frequency and Time Forum (FCS), 2015 Joint Conference of the IEEE International, Apr. 2015, 4 pages.
English language machine translation of JP 2015-115870A, published Jun. 22, 2015, 28 pages.
Maszara, "Silicon-on-Insulator by Wafer Bonding: A Review"; The Electromechanical Society, Inc., Journal of Electrochemical Society, vol. 138, No. 1, Jan. 1991, pp. 341-347.
Office Action dated Sep. 18, 2017 in co-pending U.S. Appl. No. 14/866,394, 15 pages.
Office Action dated Sep. 22, 2017 in co-pending U.S. Appl. No. 15/009,801, 13 pages.
Advisory Action dated Aug. 11, 2017 in co-pending U.S. Appl. No. 14/866,394, 4 pages.
Advisory Action dated Aug. 14, 2017 in co-pending U.S. Appl. No. 14/866,273, 6 pages.
Office Action dated Sep. 15, 2017 in co-pending U.S. Appl. No. 14/866,273, 13 pages.
English language machine translation of JP 2000-278090, published Oct. 6, 2000, 5 pages.
English language machine translation of JP 2002-330047, published Nov. 15, 2002, 9 pages.
English language machine translation of JP 2012-15767, published Jan. 19, 2012, 3 pages.
Final Office Action dated Jan. 2, 2018 in co-pending U.S. Appl. No. 14/866,273, 18 pages
Co-pending U.S. Appl. No. 15/720,002, filed Sep. 29, 2017.
Office Action dated Jun. 16, 2017 in co-pending U.S. Appl. No. 14/866,273, 11 pages.
Office Action dated Jun. 29, 2017 in co-pending U.S. Appl. No. 14/866,394, 15 pages.
Office Action dated Dec. 12, 2016 in co-pending U.S. Appl. No. 14/866,394, 71 pages.
Office Action dated Dec. 6, 2016 in co-pending U.S. Appl. No. 14/866,273, 107 pages.
Ex Parte Reexamination Certificate issued Dec. 13, 2011 for U.S. Pat. No. 6,060,818, 4 pages.
English language machine translation of JP4723207, published Jul. 13, 2011, 14 pages.
English language machine translation of JP2005-229455, published Aug. 25, 2005, 9 pages.
English language machine translation of JP5814727, published Nov. 17, 2015, 16 pages.
English language machine translation of JP56-114423, published Sep. 9, 1981, 2 pages.
Kobayashi et al., "A Study on Temperature-Compensated Hybrid Substrates for Surface Acoustic Wave Filters", 2010 IEEE International Ultrasonics Symposium Proceedings, p. 637-640.
Office Action dated Dec. 1, 2016 in co-pending U.S. Appl. No. 14/835,679, 107 pages.
Notice of Allowance dated Oct. 19, 2017 in co-pending U.S. Appl. No. 14/835,679, 5 pages.
Notice of Allowance dated Jan. 31, 2018 in co-pending U.S. Appl. No. 15/009,801, 13 pages.
Yu, "How to Grow Stoichiometric Lithium Niobate Crystals with a Continous Feed Czochralski Crystal Puller (Part I)" Excerpt from "Lithium Niobate Crystals", 1999, [online] [retrieved on Jan. 28, 2018]. Retrieved from the Internet <URL: https://www.hofstragroup.com/article/how-grow-stoichiometric-lithium-niobate-crystals-continous-feed-czochralski-crystal-puller-part-i>, 1 page.

(56) References Cited

OTHER PUBLICATIONS

"Czochralski Process", From Wikipedia, the free encycolpedia [online] [retrieved on Jan. 28, 2018]. Retrieved from the Internet <URL: https://en.wikipedia.org/wiki/Czochralski_process>, 2 pages.
Kosmyna, et al., "Development of Growth Technologies for the Photonic Single Crystals by the Czochralski Method at Institute for Single Crystals, NAS of Ukraine", Acta Physica Polonica A, vol. 124, No. 3, 2013, p. 305-313.

* cited by examiner

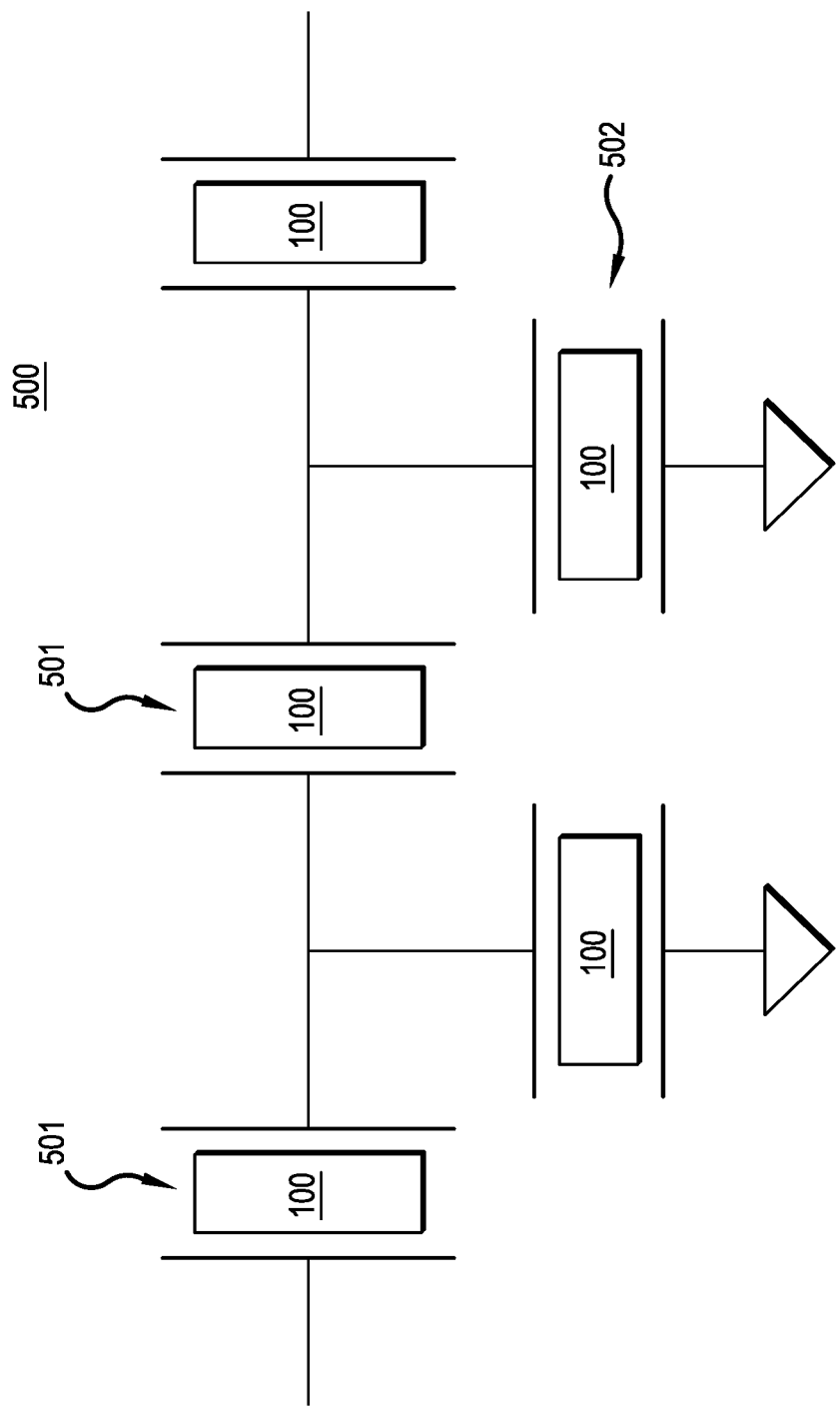

SURFACE ACOUSTIC WAVE (SAW) RESONATOR

BACKGROUND

Electrical resonators are widely incorporated in modern electronic devices. For example, in wireless communications devices, radio frequency (RF) and microwave frequency resonators are used in filters, such as filters having electrically connected series and shunt resonators forming ladder and lattice structures. The filters may be included in a duplexer (diplexer, triplexer, quadplexer, quintplexer, etc.) for example, connected between an antenna (there could be several antennas like for MIMO) and a transceiver for filtering received and transmitted signals.

Various types of filters use mechanical resonators, such as surface acoustic wave (SAW) resonators. The resonators convert electrical signals to mechanical signals or vibrations, and/or mechanical signals or vibrations to electrical signals.

While certain surface modes are desired, certain standing spurious modes can exists between the opposing faces of the piezoelectric material of the SAW resonator. These spurious modes are parasitic, and can impact the performance of filters comprising SAW resonators.

What is needed, therefore, is a SAW resonator structure that overcomes at least the shortcomings of known SAW resonators described above.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 5 is a simplified schematic block diagram of a filter comprising a SAW resonator structure according to a representative embodiment.

DETAILED DESCRIPTION

Figure 1A:
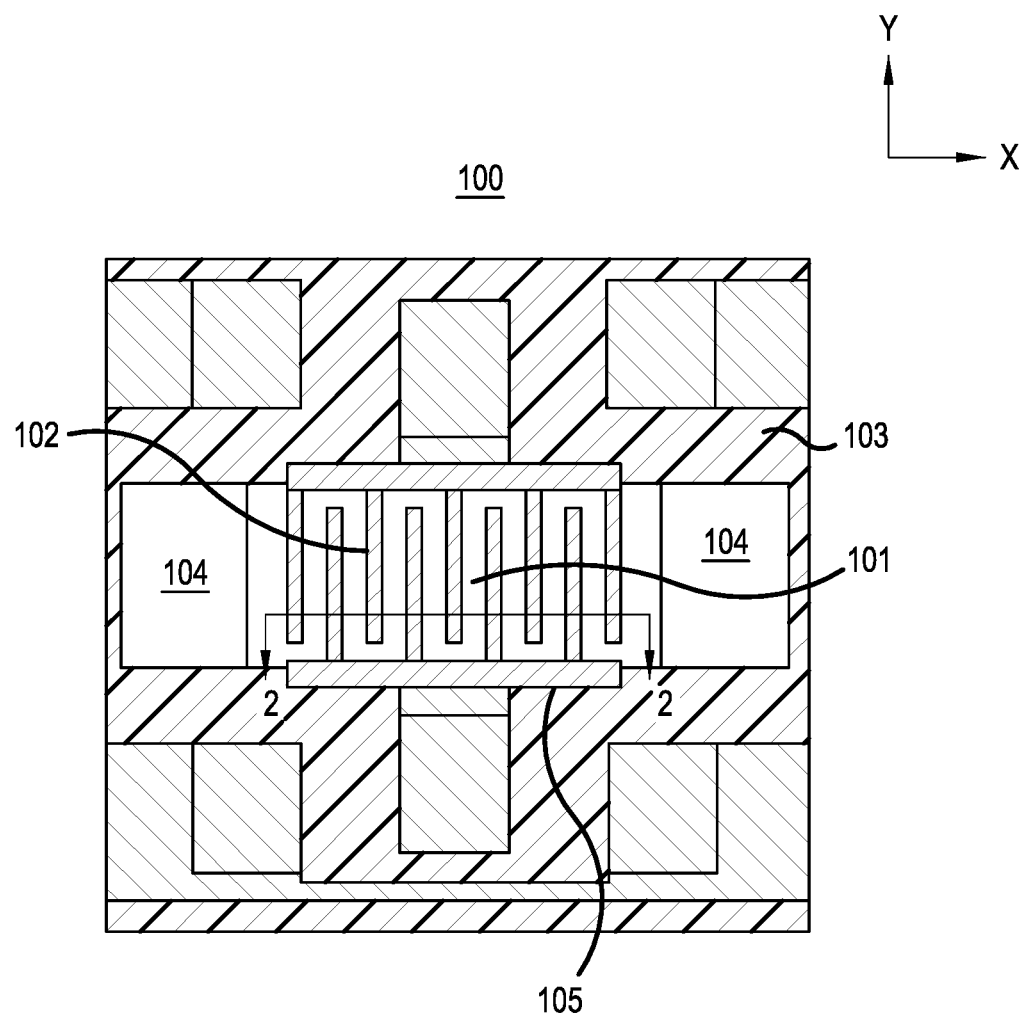
FIG. 1A is a top view of a SAW resonator structure according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

It is to be understood that the terminology used herein is for purposes of describing particular embodiments only, and is not intended to be limiting. Any defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be "below" that element. Similarly, if the device were rotated by 90° with respect to the view in the drawings, an element described "above" or "below" another element would now be "adjacent" to the other element; where "adjacent" means either abutting the other element, or having one or more layers, materials, structures, etc., between the elements.

In accordance with a representative embodiment, an apparatus comprises: a silicon (Si) substrate having a first surface and a second surface, the silicon substrate having a resistivity (at room temperature) in the range of approximately 1000 Ω-cm to approximately 15000 Ω-cm; and a piezoelectric layer disposed over the substrate and having a first surface and a second surface.

A surface acoustic wave (SAW) filter comprises a plurality of SAW resonator structures. One or more of the plurality of SAW resonator structures comprises: a silicon (Si) substrate having a first surface and a second surface, the silicon substrate having a resistivity (at room temperature) in the range of 1000 Ω-cm to approximately 15000 Ω-cm; and a piezoelectric layer disposed over the substrate and having a first surface and a second surface.

FIG. 1A is a top view of a SAW resonator structure 100 according to a representative embodiment. Notably, the SAW resonator structure 100 is intended to be merely illustrative of the type of device that can benefit from the present teachings. Other types of SAW resonators, including, but not limited to dual mode SAW (DMS) resonators, and structures therefor, are contemplated by the present teachings. The SAW resonator structure 100 of the present teachings is contemplated for a variety of applications. By way of example, and as described in connection with FIG. 5, a plurality of SAW resonator structures 100 can be connected in a series/shunt arrangement to provide a ladder filter.

The SAW resonator structure 100 comprises a piezoelectric layer 103 disposed over a substrate (not shown in FIG. 1A). In accordance with representative embodiments, the piezoelectric layer 103 comprises one of lithium niobate ($LiNbO_3$), which is commonly abbreviated LN; or lithium tantalate ($LiTaO_3$), which is commonly abbreviated LT.

The SAW resonator structure 100 comprises an active region 101, which comprises a plurality of interdigitated electrodes 102 disposed over a piezoelectric layer 103, with acoustic reflectors 104 situated on either end of the active region 101. In the presently described representative embodiment, electrical connections are made to the SAW resonator structure 100 using the busbar structures 105.

As is known, the pitch of the resonator electrodes determines the resonance conditions, and therefore the operating frequency of the SAW resonator structure 100. Specifically, the interdigitated electrodes are arranged with a certain pitch between them, and a surface wave is excited most strongly when its wavelength $\lambda$ is the same as the pitch of the electrodes. The equation $f_0 = v/\lambda$ describes the relation between the resonance frequency ($f_0$), which is generally the operating frequency of the SAW resonator structure 100, and the propagation velocity (v) of a surface wave. These SAW waves comprise Rayleigh or Leaky waves, as is known to one of ordinary skill in the art, and form the basis of function of the SAW resonator structure 100.

Figure 2:
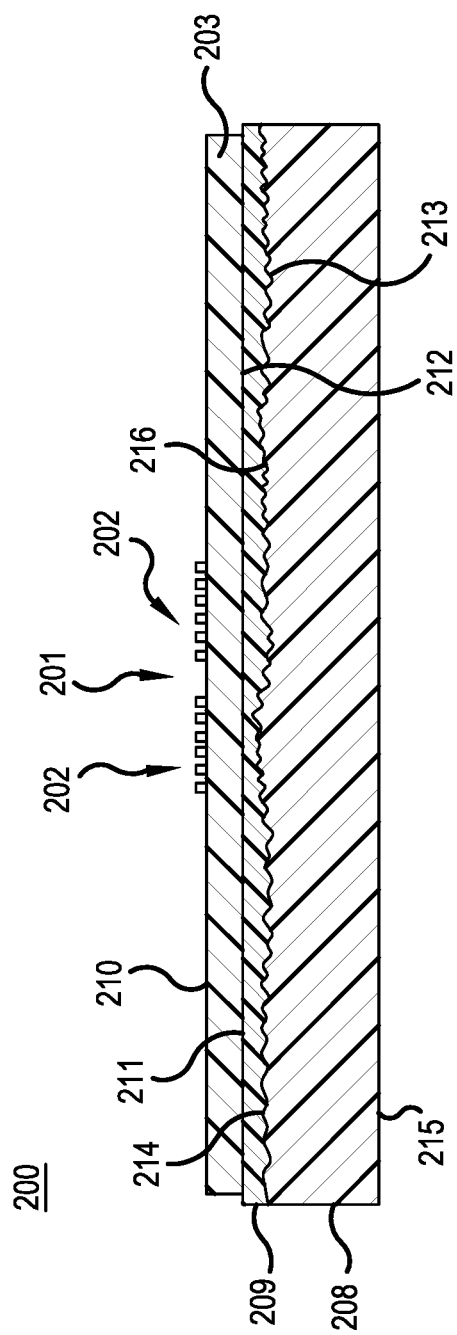
FIG. 2 is the cross-sectional view of SAW resonator structure of FIG. 1A along line 2-2.

Generally, there is a desired fundamental mode, which is typically a Leaky mode, for the SAW resonator structure 100. By way of example, if the piezoelectric layer 103 is a 42° rotated LT, the shear horizontal mode, having a displacement in the plane of the interdigitated electrodes 102 (the x-y plane of the coordinate system of FIG. 1A), is a fundamental mode. The displacement of this fundamental mode is substantially restricted to near the upper surface (e.g., first surface 210 as depicted in FIG. 2) of the piezoelectric layer 103. It is emphasized that the 42° rotated LT piezoelectric layer 103, and the shear horizontal mode are merely illustrative of the piezoelectric layer 103 and desired fundamental mode, and other materials and desired fundamental modes are contemplated.

Figure 1B:
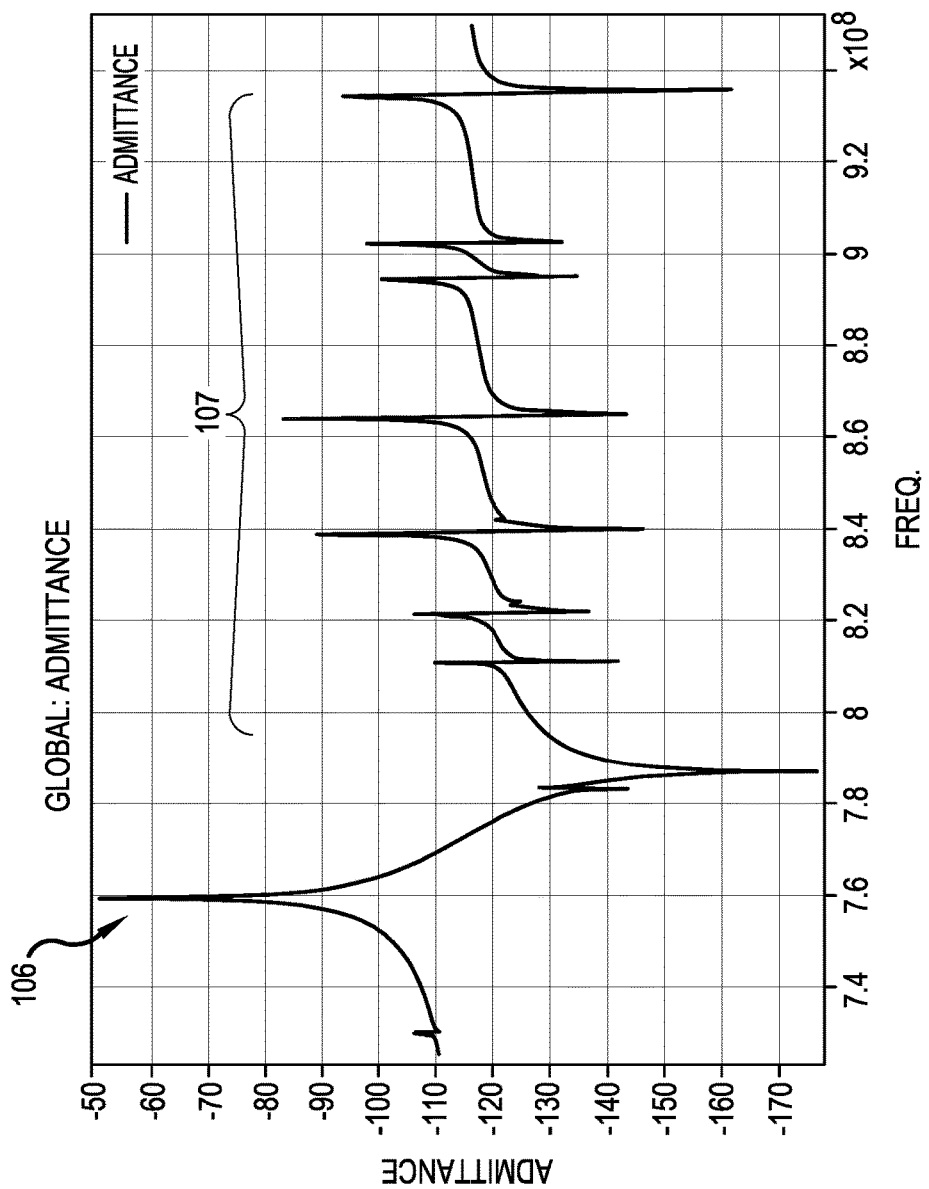
FIG. 1B is a graph of admittance versus frequency.

However, other undesired modes, which are often referred to as spurious modes, are established. Turning to FIG. 1B, a graph of admittance versus frequency is depicted for the illustrative 42° rotated LT piezoelectric layer 103. The desired fundamental mode, the shear horizontal mode 106, is substantially restricted to the upper surface of the piezoelectric layer 103, and has a frequency at series resonance ($F_s$). However, a number of spurious modes 107 having frequencies greater than the frequency at parallel resonance ($F_p$), can exist in the piezoelectric layer 103. As described for example in commonly owned, co-pending U.S. patent application Ser. No. 14/835,679, the entire disclosure of which is specifically incorporated herein by reference, these spurious modes 107 are created by acoustic waves generated in the piezoelectric layer 103 that establish standing wave of various kinds of modes (with different modal shapes and frequencies). More specifically, these spurious modes 107 are created by reflections at the interface of the piezoelectric layer 103 and the substrate of the SAW resonator structure 100.

The spurious modes can deleteriously impact the performance of SAW resonators, and devices (e.g., filters) that include SAW resonators, if not mitigated. Most notably, if a first filter is comprised of one or more SAW resonators, and is connected to a second filter having a passband that overlaps the frequency of the spurious modes, a sharp reduction in the quality (Q) of the second filter will occur.

The spurious modes are observed on a so-called Q-circle of a Smith Chart of the $S_{11}$ parameter. These sharp reductions in Q-factor are known as "rattles," and are strongest in the southeast quadrant of the Q-circle. As described more fully below, the thickness of the piezoelectric layer 103 impacts the frequency spacing of the spurious modes, as well as their magnitude. According to representative embodiments, the thickness of the piezoelectric layer is selected to be comparatively thin to improve heat dissipation of the SAW resonator structure 100, but not too thin in order to avoid certain comparatively high magnitude bulk wave spurious modes. Beneficially, significant mitigation of the adverse impact of these spurious modes is realized by the various aspects of the present teachings as described below.

FIG. 2 is a cross-sectional view of the SAW resonator structure 100 depicted in FIG. 1A along the lines 2-2. The SAW resonator structure 200 comprises an active region 201, which comprises a plurality of interdigitated electrodes 202 disposed over a piezoelectric layer 203. The SAW resonator structure 200 further comprises a substrate 208 disposed beneath the piezoelectric layer 203, and a layer 209 disposed between the substrate 208 and the piezoelectric layer 203.

As noted above, the piezoelectric layer 203 illustratively comprises one of LN or LT. Generally, in the representative embodiments described below, the piezoelectric layer 203 is a wafer that is previously fabricated, and that is adhered to the layer 209 by atomic bonding as described more fully below.

The materials selected for the piezoelectric layer 203 can be divided into two types: one which has been used for a long time and with a high degree of freedom in design is used for Rayleigh wave substrates; the other, with less freedom and limited in design, is for Leaky wave substrates with low loss characteristics and easily reaches the higher frequencies by high acoustic velocity, and are mainly used for mobile communications. LN and LT materials are often used for broadband filters, and according to the filter specifications the manufacturing materials and cutting angles differ. Filters for applications that require comparatively low loss generally require Leaky wave materials, while Rayleigh wave materials are predominately used for communication equipment that requires low ripple and low group delay characteristics. Among Rayleigh wave materials, ST-cut crystal has the best temperature characteristics as a piezoelectric material.

Many known LT and LN piezoelectric layers used in known SAW resonator/filter applications are doped with iron (Fe) to improve structural/mechanical strength of the material. While beneficial during processing of the known LT or LN piezoelectric layers, these mechanically strengthened known LT and LN piezoelectric materials have dipoles in the lattice structure thereof. The free carriers created in the Fe doped LT or LN layers increase the loss tangent of the SAW resonator structure in which these known LT and LN layers are disposed, ultimately negatively impacting the quality (Q) factor and the insertion loss of the SAW resonator filter.

By contrast, the piezoelectric layer 203 of the representative embodiment of FIG. 2 is not intentionally doped with iron (Fe) or any other material to provide the structural/mechanical rigidity and strength. Stated somewhat differently, the piezoelectric layer 203 is substantially free of iron (Fe), or without iron (Fe) therein. Notably, the piezoelectric layer 203 is bonded directly to the substrate 208, or, as described below and in above-incorporated U.S. patent application Ser. No. 14/835,679, the piezoelectric layer 203 is bonded to the substrate 208 with layer 209 therebetween. The substrate 208, or the combination of substrate 208 and layer 209 provides suitable structural strength during further processing to fabricate the SAW resonator structure 200 to allow the piezoelectric layer 203 to not be doped with iron or any other dopant.

Additionally, during processing many known LT and LN layers used in known SAW resonator structures are introduced to a comparatively high-temperature, highly reducing atmosphere. The highly reducing atmosphere introduces oxygen donors to the piezoelectric layer, in a processing that is commonly referred to as "blackening" due to the appearance of the LT or LN layer after the reducing step. The process of blackening is done to provide donors that recombine with surface charge created by the pyroelectric effect. As such, by doping the LT or LN layer with oxygen in known SAW resonator structures, any voltage build up on the surface due to a temperature gradient is dissipated by charges inside the substrate. However, the additional free carriers provided by the oxygen dopants increases parasitic losses, manifest in an unacceptable loss tangent, reduced insertion loss, and reduced Q in the known SAW resonator.

By contrast, the piezoelectric layer 203 is not subjected to a high temperature, highly reducing atmosphere. As such, the piezoelectric layer 203 is not intentionally doped with oxygen. Beneficially, the piezoelectric layer 203 has a low loss tangent compared to known so-called blackened LT or LN layers described above. Any surface charge created by the pyroelectric effect is dissipated by the substrate 208, which, as described below, is silicon.

In accordance with a representative embodiment, the piezoelectric layer 203 of the representative embodiments is not intentionally doped with iron, or introduced into a high temperature, highly reducing atmosphere to create donor sites (i.e., not intentionally doped with oxygen). As such, the piezoelectric layer has a direct current (DC) electrical resistivity (measured at room temperature) greater than approximately $10^{12}$ Ω-cm and less than approximately $10^{15}$ Ω-cm; and an optical absorptivity of greater than approximately 0.1 $cm^{-1}$ to less than approximately 1.0 $cm^{-1}$ at an optical wavelength of approximately 500 nm. Beneficially, compared to known iron doped and oxygen doped piezoelectric layers, the loss tangent of the piezoelectric layer 203 of the representative embodiments is very low. Thus, losses associated with a poor loss tangent are significantly mitigated.

The piezoelectric layer 203 (a so-called 'white' LT or LN layer) is bonded to substrate 208 using a method described in the above-incorporated patent application, or in commonly owned U.S. patent application Ser. Nos. 14/866,394 and 15/009,801, the disclosures of which are specifically incorporated herein by reference. Notably, the piezoelectric layer 203 is bonded to the substrate 208 comparatively quickly after back-grinding to a desired thickness, and CMP polished as described in one or more of the above-referenced patent applications. Notably, the bonding and back-grinding are performed at or near room temperature thereby avoiding significant charge build-up due to the pyroelectric effect. Further processing is then performed on the combined LT (or LN)/Si substrate to provide a SAW resonator structure.

As noted above, the thickness of the piezoelectric layer 203 is selected to be comparatively thin to improve heat dissipation of the SAW resonator structure 200, but not too thin in order to avoid certain comparatively high magnitude bulk wave spurious modes. In accordance with a representative embodiment, the piezoelectric layer has a thickness in the range of approximately 5.0 μm to approximately 30.0 μm. In addition to providing the conditions to support desired acoustic modes in a SAW resonator structure and SAW filter comprising SAW resonator structures of the representative embodiments, the comparatively thin piezoelectric layer 203 can dissipate heat comparatively easily through the silicon substrate 208. To this end, LT and LN have a comparatively high thermal resistance. So, the greater the thickness of the LT or LN layer (piezoelectric layer 203), the more difficult it is to dissipate heat generated therein, and the more likely pyroelectric charge will build up. However, by providing the comparatively thin piezoelectric layer 203 over a silicon substrate 208, which has a comparatively low thermal resistance, heat generated in the piezoelectric layer 203 will efficiently be dissipated. As such, the silicon substrate will act to always keep the temperature gradient across the piezoelectric layer 203 and substrate 208 comparatively low.

In accordance with a representative embodiment, the substrate 208 comprises crystalline silicon, which may be polycrystalline or monocrystalline, having thickness of approximately 100.0 μm to approximately 800.0 μm. As described in the above incorporated application, the material selected for use as the substrate 208, among other considerations, is selected for ease of micromachining, using one or more of a variety of known techniques. Generally, the substrate 208 comprises a material having a comparatively high electrical resistivity. Illustratively, the resistivity (measured at room temperature) of the substrate 208 is in the range of approximately 1000 Ω-cm to approximately 15000 Ω-cm, in order to improve the performance of a filter comprising SAW resonator structure(s) 200. The comparatively high resistivity results from a comparatively low carrier concentration, which reduces coupling of the SAW resonator to the substrate 208. Beneficially, substantial parasitic losses can be avoided through the incorporation of the substrate 208 of the representative embodiments. Illustratively, the substrate 208 may comprise single crystal silicon that is doped to a comparatively high resistivity.

The layer 209 is illustratively an oxide material, such as $SiO_2$, or phosphosilicate glass (PSG), borosilicate glass (BSG), a thermally grown oxide, or other material amenable to polishing to a high degree of smoothness, as described more fully below. The layer 209 is deposited by a known method, such as chemical vapor deposition (CVD) or plasma enhanced chemical vapor deposition (PECVD), or may be thermally grown. As described more fully in the above-incorporated application, the layer 209 is polished to a thickness in the range of approximately 0.05 μm to approximately 6.0 μm.

The piezoelectric layer 203 has a first surface 210, and a second surface 211, which opposed the first surface 210. Similarly, the layer 209 has a first surface 212 and a second surface 213. As depicted in FIG. 2, the first surface 212 of the layer 209 is atomically bonded to the second surface 211 of the piezoelectric layer 203, as described more fully below.

The substrate 208 has a first surface 214 and a second surface 215 opposing the first surface 214. The first surface 214 has a plurality of features 216 there-across. As noted above, undesired spurious modes are launched in the piezoelectric layer 203, and propagate down to the first surface 214. As described in U.S. patent application Ser. No. 14/835,679, the plurality of features 216 reflect undesired spurious modes at various angles and over various distances to destructively interfere with the undesired spurious waves in the piezoelectric layer 203, and possibly enable a portion of these waves to be beneficially converted into desired SAW waves. Again as described more fully below, the reflections provided by the plurality of features 216 foster a reduction in the degree of spurious modes (i.e., standing waves), which are created by the reflection of acoustic waves at the interface of the second surface 211 of the piezoelectric layer 203 and the first surface 212 of layer 209. Ultimately, the reflections provided by the plurality of features 216 serve to improve the performance of devices (e.g., filters) that comprise a plurality of SAW resonator structures 200.

As described in one or more of the above-incorporated patent applications, the first surface 212 of layer 209 is polished, such as by chemical-mechanical polishing in order to obtain a "mirror" like finish with a comparatively low root-mean-square (RMS) variation of height. In accordance with a representative embodiment, the first surface 212 of the layer 209 has a root-mean-square (RMS) variation in height of approximately 0.1 Å to approximately 10.0 Å. This low RMS variation of height significantly improves the contact area between the first surface 212 of the layer 209 and the second surface 211 of the piezoelectric layer 203 to improve the atomic bonding between the first surface 212 and the second surface 211. As is known, the bond strength realized by atomic bonding is directly proportional to the contact area between two surfaces. As such, improving the flatness/smoothness of the first surface 212 fosters an increase in the contact area, thereby improving the bond of the layer 209 to the piezoelectric layer 203. As used herein, the term atomically smooth means sufficiently smooth to provide sufficient contact area to provide a sufficiently strong bond strength between the layer 209 and the piezoelectric layer 203, at the interface of their first and second surfaces 212, 211, respectively.

As described in the above-incorporated patent applications, one measure of the impact of the parasitic spurious modes on the performance of a device (e.g., filter) comprising a SAW resonator is the quality (Q) factor. For example, the parasitic spurious modes couple at the interfaces of the piezoelectric layer 203 and remove energy available for the desired SAW modes and thereby reduce the Q-factor of the resonator device. As is known, the Q-circle of Smith Chart has a value of unity along its circumferences. The degree of energy loss (and therefore reduction in Q) is depicted with the reduction of the S parameter off the unit circle. Notably, as a result of parasitic spurious modes and other acoustic losses, sharp reductions in Q of known devices can be observed on a so-called Q-circle of a Smith Chart of the $S_{11}$ parameter. These sharp reductions in Q-factor are known as "rattles" and are strongest in the southeast quadrant of the Q-circle. Beneficially, because of the diffuse reflections, and attendant phase mismatch of the reflected acoustic waves realized by the plurality of features 216, compared to such known devices, a filter comprising SAW resonator structure 100 of representative embodiments of the present teachings, show lesser magnitudes of the "rattles," and a somewhat "spreading" of the reduced "rattles" is experienced.

Figure 3:
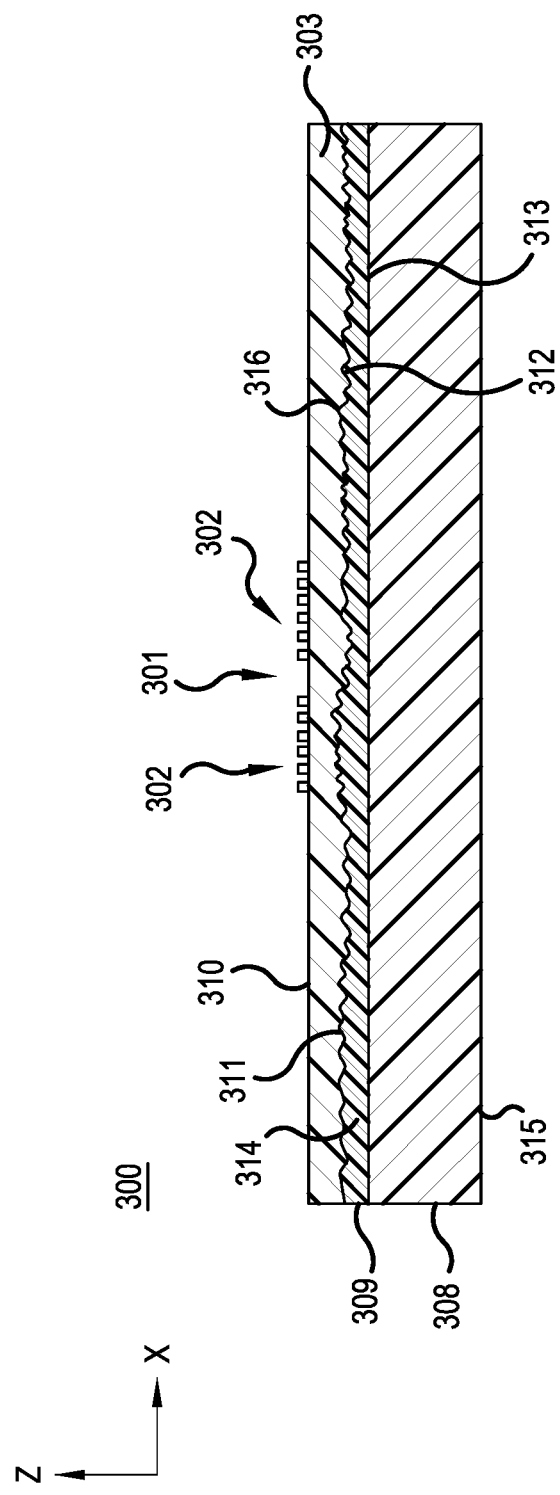
FIG. 3 is a cross-sectional view of a portion of a SAW resonator in accordance with a representative embodiment.

FIG. 3 is a cross-sectional view of a SAW resonator structure 300 in accordance with a representative embodiment. Many aspects and details of the SAW resonator structure 300, are described above, and in above-incorporated U.S. patent application Ser. No. 14/866,394. Often, these common aspects and details are not repeated in order to avoid obscuring the description of the presently described representative embodiments.

The SAW resonator structure 300 comprises an active region 301, which comprises a plurality of interdigitated electrodes 302 disposed over a piezoelectric layer 303. The SAW resonator structure 300 further comprises a substrate 308 disposed beneath the piezoelectric layer 303, and a layer 309 disposed between the substrate 308 and the piezoelectric layer 303.

As noted above, the piezoelectric layer 303 illustratively comprises one of LN or LT. Generally, in the representative embodiments described below, the piezoelectric layer 303 is a wafer that is previously fabricated, and that is adhered to the layer 309 by atomic bonding as described more fully below.

The materials selected for the piezoelectric layer 303 can be divided into two types: one which has been used for a long time and with a high degree of freedom in design is used for Rayleigh wave substrates; the other, with less freedom and limited in design, is for Leaky wave substrates with low loss characteristics and easily reaches the higher frequencies by high acoustic velocity, and are mainly used for mobile communications. LN and LT materials are often used for broadband filters, and according to the filter specifications, the manufacturing materials and cutting angles differ. Filters for applications that require comparatively low loss mainly generally require Leaky wave materials, while Rayleigh wave materials are predominately used for communication equipment that requires low ripple and low group delay characteristics. Among Rayleigh wave materials, ST-cut crystal has the best temperature characteristics as a piezoelectric material.

The piezoelectric layer 303 of the representative embodiment of FIG. 3 is not intentionally doped with iron (Fe) or any other material to provide the structural/mechanical rigidity and strength. Stated somewhat differently, the piezoelectric layer 303 is substantially free of iron (Fe), or without iron (Fe) therein. Notably, the piezoelectric layer 303 is bonded directly to the substrate 308, or, as described below and in above-incorporated U.S. patent application Ser. No. 14/835,679, the piezoelectric layer 303 is bonded to the substrate 308 with layer 309 therebetween. The substrate 308, or the combination of substrate 308 and layer 309, provides suitable structural strength during further processing to fabricate the SAW resonator structure 300 to allow the piezoelectric layer 303 to not be doped with iron or any other dopant.

Additionally, during processing many known LT and LN layers used in known SAW resonator structures are introduced to a comparatively high-temperature, highly reducing atmosphere. The highly reducing atmosphere introduces oxygen donors to the piezoelectric layer, in a processing that is commonly referred to as "blackening" due to the appearance of the LT or LN layer after the reducing step. The process of blackening is done to provide donors that recombine with surface charge created by the pyroelectric effect. As such, by doping the LT or LN layer with oxygen in known SAW resonator structures, any voltage build up on the surface due to a temperature gradient is dissipated by charges inside the substrate. However, the additional free carriers provided by the oxygen dopants increases parasitic losses, manifest in an unacceptable loss tangent, reduced insertion loss, and reduced Q in the known SAW resonator.

By contrast, the piezoelectric layer 303 is not subjected to a high temperature, highly reducing atmosphere. As such, the piezoelectric layer 303 is not intentionally doped with oxygen. Beneficially, the piezoelectric layer 303 has a low loss tangent compared to known so-called blackened LT or LN layers described above. Any surface charge created by the pyroelectric effect is dissipated by the substrate 308, which, as described below, is silicon.

In accordance with a representative embodiment, the piezoelectric layer 303 of the representative embodiments is not intentionally doped with iron, or introduced into a high temperature, highly reducing atmosphere to create donor sites (i.e., not intentionally doped with oxygen). As such, the piezoelectric layer has a direct current (DC) electrical resistivity (measured at room temperature) greater than approximately $10^{12}$ Ω-cm and less than approximately $10^{15}$ Ω-cm; and an optical absorptivity of greater than approximately 0.1 $cm^{-1}$ to less than approximately 1.0 $cm^{-1}$ at an optical wavelength of approximately 500 nm. Beneficially, compared to known iron and oxygen doped piezoelectric layers, the loss tangent of the piezoelectric layer 303 of the representative embodiments is very low. Thus, losses associated with a poor loss tangent are significantly mitigated.

The piezoelectric layer 303 (a so-called 'white' LT or LN layer) is bonded to substrate 308 using a method described in the above-incorporated patent application, or in commonly owned U.S. patent application Ser. Nos. 14/866,394 and 15/009,801, the disclosures of which are specifically incorporated herein by reference. Notably, the piezoelectric layer 303 is bonded to the substrate 308 comparatively quickly after back-grinding to a desired thickness, and CMP polished as described in one or more of the above-referenced patent applications. Notably, the bonding and back-grinding are performed at or near room temperature thereby avoiding significant charge build-up due to the pyroelectric effect. Further processing is then performed on the combined LT (or LN)/Si substrate to provide a SAW resonator structure.

As noted above, the thickness of the piezoelectric layer 303 is selected to be comparatively thin to improve heat dissipation of the SAW resonator structure 300, but not too thin in order to avoid certain comparatively high magnitude bulk wave spurious modes. In accordance with a representative embodiment, the piezoelectric layer has a thickness in the range of approximately 5.0 μm to approximately 30.0 μm. In addition to providing the conditions to support desired acoustic modes in a SAW resonator structure and SAW filter comprising SAW resonator structures of the representative embodiments, the comparatively thin piezoelectric layer 303 can dissipate heat comparatively easily through the silicon substrate 308. To this end, LT and LN have a comparatively high thermal resistance. So, the greater the thickness of the LT or LN layer (piezoelectric layer 303), the more difficult it is to dissipate heat generated therein, and the more likely pyroelectric charge will build up. However, by providing the comparatively thin piezoelectric layer 303 over a silicon substrate 308, which has a comparatively low thermal resistance, heat generated in the piezoelectric layer 303 will efficiently be dissipated. As such, the silicon substrate will act to always keep the temperature gradient across the piezoelectric layer 303 and substrate 308 comparatively low.

In accordance with a representative embodiment, the substrate 308 comprises crystalline silicon, which may be polycrystalline or monocrystalline, having thickness of approximately 100.0 μm to approximately 800.0 μm. As described in the above incorporated application, the material selected for use as the substrate 308, among other considerations, is selected for ease of micromachining, using one or more of a variety of known techniques. Generally, the substrate 308 comprises a material having a comparatively high electrical resistivity. Illustratively, the resistivity (measured at room temperature) of the substrate 308 is in the range of approximately 1000 Ω-cm to approximately 15000 Ω-cm, in order to improve the performance of a filter comprising SAW resonator structure(s) 300. The comparatively high resistivity results from a comparatively low carrier concentration, which reduces coupling of the SAW resonator to the substrate 308. Beneficially, substantial parasitic losses can be avoided through the incorporation of the substrate 308 of the representative embodiments, the substrate 308 may comprise a comparatively high-resistivity material. Illustratively, the substrate 308 may comprise single crystal silicon that is doped to a comparatively high resistivity.

The layer 309 is illustratively an oxide material, such as silicon dioxide ($SiO_2$), or phosphosilicate glass (PSG), borosilicate glass (BSG), a thermally grown oxide, or other material amenable to polishing to a high degree of smoothness, as described more fully below. The layer 309 is deposited by a known method, such as chemical vapor deposition (CVD) or plasma enhanced chemical vapor deposition (PECVD), or may be thermally grown. As described more fully below, the layer 309 is polished to a thickness in the range of approximately 0.05 μm to approximately 6.0 μm.

The piezoelectric layer 303 has a first surface 310, and a second surface 311, which opposes the first surface 310. The second surface 311 has a plurality of features 316 thereacross. As noted above, undesired spurious modes are launched in the piezoelectric layer 303, and propagate down to the second surface 311. As described in U.S. patent application Ser. No. 14/866,394, the plurality of features 316 reflect undesired spurious modes at various angles and over various distances to destructively interfere with the undesired spurious waves in the piezoelectric layer 303, and possibly enable a portion of these waves to be beneficially converted into desired SAW waves. Again as described more fully below, the reflections provided by the plurality of features 316 foster a reduction in the degree of spurious modes (i.e., standing waves), which are created by the reflection of acoustic waves at the interface of the second surface 311 of the piezoelectric layer 303 and the first surface 312 of layer 309. Ultimately, the reflections provided by the plurality of features 316 serve to improve the performance of devices (e.g., filters) that comprise a plurality of SAW resonator structures 300.

The substrate 308 has a first surface 314 and a second surface 315 opposing the first surface 314. In representative embodiments, the substrate 308 undergoes a chemical-mechanical polish (CMP) sequence to prepare the first surface 314 to bond to the layer 309, as described below.

Layer 309 has a first surface 312 and a second surface 313. As noted above, and as described more fully in U.S. patent application Ser. No. 14/866,394, the second surface 313 of layer 309 is polished, such as by chemical-mechanical polishing in order to obtain a "mirror" like finish with a comparatively low root-mean-square (RMS) variation of height. In accordance with a representative embodiment, the second surface 313 of the layer 309 has a root-mean-square (RMS) variation in height of approximately 0.1 Å to approximately 10.0 Å. This low RMS variation of height significantly improves the contact area between the second surface 313 of the layer 309 and the first surface 314 of the substrate 308 to improve the atomic bonding between the first surface 314 and the second surface 313. As is known, the bond strength realized by atomic bonding is directly proportional to the contact area between two surfaces. As such, improving the flatness/smoothness of the second surface 313 fosters an increase in the contact area, thereby improving the bond of the layer 309 to the substrate 308. As used herein, the term atomically smooth means sufficiently smooth to provide sufficient contact area to provide a sufficiently strong bond strength between the layer 309 and the substrate 308, at the interface of their second and first surfaces 313, 314, respectively.

Figure 4:
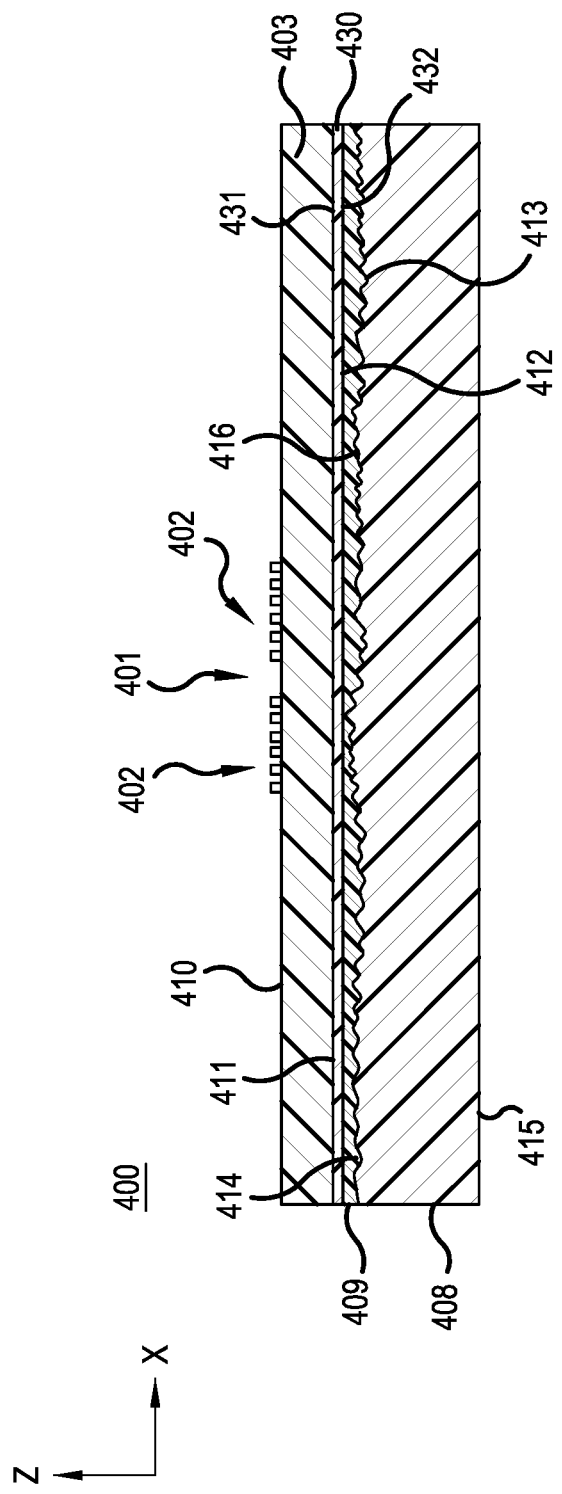
FIG. 4 is a cross-sectional view of a portion of a SAW resonator in accordance with a representative embodiment.

FIG. 4 is a cross-sectional view of a SAW resonator structure 400 depicted in accordance with a representative embodiment. Many aspects and details of the SAW resonator structure 400, are described above, and in above-incorporated U.S. patent application Ser. No. 15/009,801. Often, these common aspects and details are not repeated in order to avoid obscuring the description of the presently described representative embodiments.

The SAW resonator structure 400 comprises an active region 401, which comprises a plurality of interdigitated electrodes 402 disposed over a piezoelectric layer 403. The SAW resonator structure 400 comprises a substrate 408 disposed beneath the piezoelectric layer 403, a layer 409 is disposed over the substrate 408, and a silicon layer 430 is disposed between the layer 409 and the piezoelectric layer 403.

As noted above, the piezoelectric layer 403 illustratively comprises one of LN or LT. Generally, in the representative embodiments described below, the piezoelectric layer 403 is a wafer that is previously fabricated, and that is adhered to the layer 409 by atomic bonding as described more fully below.

The materials selected for the piezoelectric layer 403 can be divided into two types: one which has been used for a long time and with a high degree of freedom in design is used for Rayleigh wave substrates; the other, with less freedom and limited in design, is for Leaky wave substrates with low loss characteristics and easily reaches the higher frequencies by high acoustic velocity, and are mainly used for mobile communications. LN and LT materials are often used for broadband filters, and according to the filter specifications the manufacturing materials and cutting angles differ. Filters for applications that require comparatively low loss generally require Leaky wave materials, while Rayleigh wave materials are predominately used for communication equipment that requires low ripple and low group delay characteristics. Among Rayleigh wave materials, ST-cut crystal has the best temperature characteristics as a piezoelectric material.

The piezoelectric layer 403 is not subjected to a high temperature, highly reducing atmosphere. As such, the piezoelectric layer 403 has a low loss tangent compared to known so-called blackened LT or LN layers described above. Any surface charge created by the pyroelectric effect is dissipated by the substrate 408, which, as described below, is silicon.

In accordance with a representative embodiment, the piezoelectric layer 403 of the representative embodiments is not intentionally doped with iron, or introduced into a high temperature, highly reducing atmosphere to create donor sites (i.e., not intentionally doped with oxygen). As such, the piezoelectric layer has a direct current (DC) electrical resistivity (measured at room temperature) greater than approximately $10^{12}$ $\Omega$-cm and less than approximately $10^{15}$ $\Omega$-cm; and an optical absorptivity of greater than approximately 0.1 $cm^{-1}$ to less than approximately 1.0 $cm^{-1}$ at an optical wavelength of approximately 500 nm. Beneficially, compared to known iron and oxygen doped piezoelectric layers, the loss tangent of the piezoelectric layer 403 of the representative embodiments is very low. Thus, losses associated with a poor loss tangent are significantly mitigated.

The piezoelectric layer 403 (a so-called 'white' LT or LN layer) is bonded to substrate 408 using a method described in U.S. patent application Ser. No. 15/009,801, the disclosures of which are specifically incorporated herein by reference. Notably, the piezoelectric layer 403 is bonded to the substrate 408 comparatively quickly after back-grinding to a desired thickness, and CMP polished as described in one or more of the above-referenced patent applications. Notably, the bonding and back-grinding are performed at or near room temperature thereby avoiding significant charge build-up due to the pyroelectric effect. Further processing is then performed on the combined LT (or LN)/Si substrate to provide a SAW resonator structure.

As noted above, the thickness of the piezoelectric layer 403 is selected to be comparatively thin to improve heat dissipation of the SAW resonator structure 400, but not too thin in order to avoid certain comparatively high magnitude bulk wave spurious modes. In accordance with a representative embodiment, the piezoelectric layer has a thickness in the range of approximately 5.0 μm to approximately 30.0 μm. In addition to providing the conditions to support desired acoustic modes in a SAW resonator structure and SAW filter comprising SAW resonator structures of the representative embodiments, the comparatively thin piezoelectric layer 403 can dissipate heat comparatively easily through the silicon substrate 408. To this end, LT and LN have a comparatively high thermal resistance. So, the greater the thickness of the LT or LN layer (piezoelectric layer 403), the more difficult it is to dissipate heat generated therein, and the more likely pyroelectric charge will build up. However, by providing the comparatively thin piezoelectric layer 403 over a silicon substrate 408, which has a comparatively low thermal resistance, heat generated in the piezoelectric layer 403 will efficiently be dissipated. As such, the silicon substrate will act to always keep the temperature gradient across the piezoelectric layer 403 and substrate 408 comparatively low.

In accordance with a representative embodiment, the substrate 408 comprises crystalline silicon, which may be polycrystalline or monocrystalline, having thickness of approximately 100.0 μm to approximately 800.0 μm. As described in the above incorporated application, the material selected for use as the substrate 408, among other considerations, is selected for ease of micromachining, using one or more of a variety of known techniques. Generally, the substrate 408 comprises a material having a comparatively high electrical resistivity. Illustratively, the resistivity (measured at room temperature) of the substrate 408 is in the range of approximately 1000 $\Omega$-cm to approximately 15000 $\Omega$-cm, in order to improve the performance of a filter comprising SAW resonator structure(s) 400. The comparatively high resistivity results from a comparatively low carrier concentration, which reduces coupling of the SAW resonator to the substrate 408. Beneficially, substantial parasitic losses can be avoided through the incorporation of the substrate 408 of the representative embodiments, the substrate 408 may comprise a comparatively high-resistivity material. Illustratively, the substrate 408 may comprise single crystal silicon that is doped to a comparatively high resistivity.

The layer 409 is illustratively an oxide material, such as $SiO_2$, or phosphosilicate glass (PSG), borosilicate glass (BSG), a thermally grown oxide, or other material amenable to polishing to a high degree of smoothness, as described more fully below. The layer 409 is deposited by a known method, such as chemical vapor deposition (CVD) or plasma enhanced chemical vapor deposition (PECVD), or may be thermally grown. As described more fully in U.S. patent application Ser. No. 15/009,801, the layer 409 is polished to a thickness in the range of approximately 0.05 μm to approximately 6.0 μm.

The silicon layer 430 is illustratively polycrystalline silicon (poly-Si) and is deposited using a known method, such as plasma-enhanced chemical vapor deposition (PECVD) or similar method. After deposition is complete, a cleaning step, such as a known sputtering step, is carried out to remove any oxide or debris from the first surface 431 of the silicon layer 430. This cleaning step fosters bonding of the first surface to the piezoelectric layer 403. This bonding provides good adhesion between the silicon layer 430 and the piezoelectric layer 403.

Illustratively, the silicon layer 430 has a thickness in range of approximately 100 Å to approximately one-third of the wavelength ($\lambda/3$) of a SAW wave, where the wavelength is defined by the pitch of the interdigitated electrodes 402 (IDT) and the velocity of sound in the medium ($L=v_a/2*pitch$). Generally, the thickness of the silicon layer 430 is selected to be thick enough so that it is atomically smooth and continuous, and not too thick that the desired scattering of spurious modes from the features 416 does not occur. To this end, if the silicon layer 430 is too thin, unevenness across the thickness can result in relative peaks and valleys across the first surface 431 and incomplete coverage of the underlying layer. These peaks and valleys deleteriously reduce the area of contact between the first surface 431 and the second surface 411 of the piezoelectric layer 403. By contrast, if the silicon layer 430 is too thick, the silicon layer 430 is like a substrate without features 416, allowing undesired spurious modes to propagate without incoherent reflection as is realized by the structure of the present teachings.

The piezoelectric layer 403 has a first surface 410, and a second surface 411, which opposes the first surface 410. The layer 409 has a first surface 412 and a second surface 413, and the silicon layer 430 has a first surface 431 and a second surface 432. As depicted in FIG. 4, the first surface 431 of the silicon layer 430 is atomically bonded to the second surface 411 of the piezoelectric layer 403, as described more fully in U.S. patent application Ser. No. 15/009,801.

The substrate 408 has a first surface 414 and a second surface 415 opposing the first surface 414. The first surface 414 has a plurality of features 416 there-across. As noted above, undesired spurious modes are launched in the piezoelectric layer 403, and propagate down to the first surface 414. As described more fully in U.S. patent application Ser. No. 15/009,801, the plurality of features 416 reflect undesired spurious modes at various angles and over various distances to destructively interfere with the undesired spurious waves in the piezoelectric layer 403, and possibly enable a portion of these waves to be beneficially converted into desired SAW waves. Again as described more fully in U.S. patent application Ser. No. 15/009,801, the reflections provided by the plurality of features 416 foster a reduction in the degree of spurious modes (i.e., standing waves), which are created by the reflection of acoustic waves at the interface of the second surface 411 of the piezoelectric layer 403 and the first surface 412 of layer 409. Ultimately, the reflections provided by the plurality of features 416 serve to improve the performance of devices (e.g., filters) that comprise a plurality of SAW resonator structures 400.

As described more in U.S. patent application Ser. No. 15/009,801, in accordance with a representative embodiment, the first (upper) surface 431 of silicon layer 430 is polished, such as by chemical-mechanical polishing in order to obtain a "mirror" like finish with a comparatively low root-mean-square (RMS) variation of height. In accordance with a representative embodiment, the first surface 431 of the silicon layer 430 has a root-mean-square (RMS) variation in height of approximately 0.1 Å to approximately 10.0 Å. This low RMS variation of height significantly improves the contact area between the first surface 431 of the silicon layer 430 and the second surface 411 of the piezoelectric layer 403. Accordingly, providing a low RMS variation in height improves the atomic bonding between the first surface 431 and the second surface 411. As is known, the bond strength realized by atomic bonding is directly proportional to the contact area between two surfaces. As such, improving the flatness/smoothness of the first surface 431 fosters an increase in the contact area, thereby improving the bond of the silicon layer 430 to the piezoelectric layer 403. As used herein, the term atomically smooth means sufficiently smooth to provide sufficient contact area to provide a sufficiently strong bond strength between the silicon layer 430 and the piezoelectric layer 403, at the interface of their first and second surfaces 431 and 411, respectively.

It is noted that the polishing sequence described above to provide the desired smoothness of the first side 431 of the silicon layer 430 may be foregone if the deposition sequence used to form the silicon layer 430 results in an atomically smooth first side 431.

As noted above, when connected in a selected topology, a plurality of SAW resonators can function as an electrical filter. FIG. 5 shows a simplified schematic block diagram of an electrical filter 500 in accordance with a representative embodiment. The electrical filter 500 comprises series SAW resonators 501 and shunt SAW resonators 502. The series SAW resonators 501 and shunt SAW resonators 502 may each comprise SAW resonator structures 100, 200, 300, or 400 described in connection with the representative embodiments of FIGS. 1A-4. As can be appreciated, the SAW resonator structures (e.g., a plurality of SAW resonator structures 100) that comprise the electrical filter 500 may be provided over a common substrate (e.g., substrate 108), or may be a number of individual SAW resonator structures (e.g., SAW resonator structures 100) disposed over more than one substrate (e.g., more than one substrate 108). The electrical filter 500 is commonly referred to as a ladder filter, and may be used for example in duplexer applications. It is emphasized that the topology of the electrical filter 500 is merely illustrative and other topologies are contemplated. Moreover, the acoustic resonators of the representative embodiments are contemplated in a variety of applications including, but not limited to duplexers.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. An apparatus, comprising:
   a silicon (Si) substrate having a first surface and a second surface, the silicon substrate having a resistivity at room temperature greater than approximately 1000 $\Omega$-cm, and less than approximately 15000 $\Omega$-cm; and
   a piezoelectric layer disposed over the silicon substrate and having a first surface and a second surface, wherein the piezoelectric layer has an optical absorptivity of greater than approximately 0.1 $cm^{-1}$ to less than approximately 1.0 $cm^{-1}$ at an optical wavelength of approximately 500 nm.

2. The apparatus of claim 1, wherein the piezoelectric layer comprises lithium niobate ($LiNbO_3$) or lithium tantalate ($LiTaO_3$).

3. The apparatus of claim 2, wherein the piezoelectric layer has a thickness in a range of approximately 0.5 μm to approximately 30.0 μm.

4. The apparatus of claim 2, wherein the piezoelectric layer is substantially without iron (Fe).

5. The apparatus of claim 1, further comprising:
a plurality of electrodes disposed over the first surface of the piezoelectric layer, the plurality of electrodes configured to generate surface acoustic waves in the piezoelectric layer.

6. The apparatus as claimed in claim 5, further comprising:
a layer disposed between the first surface of the silicon substrate and the second surface of the piezoelectric layer, the layer having a first surface and a second surface, either the second surface of the layer having a smoothness sufficient to foster atomic bonding between the second surface of the layer and the first surface of the silicon substrate, or the first surface of the layer having a smoothness sufficient to foster atomic bonding between the first surface of the layer and the second surface of the piezoelectric layer; and
a plurality of features on the second surface of the piezoelectric layer, or on the first surface of the silicon substrate, the plurality of features configured to reflect acoustic waves and reduce an incidence of spurious modes in the piezoelectric layer.

7. The apparatus as claimed in claim 6, wherein the reflected acoustic waves destructively interfere with acoustic waves in the piezoelectric layer.

8. The apparatus as claimed in claim 6, wherein at least some of the plurality of features have substantially slanted sides.

9. The apparatus as claimed in claim 8, wherein at least some of the plurality of features are substantially not in a regular pattern.

10. The apparatus as claimed in claim 6, wherein the at least some of the plurality of features have a height of approximately one-fourth of a wavelength (¼λ) of a spurious mode.

11. The apparatus as claimed in claim 10, wherein the at least some of the plurality of features have a height in a range of approximately 0.25 μm to approximately 1.5 μm.

12. The apparatus as claimed in claim 10, wherein the at least some of the plurality of features have a height in a range of approximately 0.1 μm to approximately 2.50 μm.

13. The apparatus as claimed in claim 6, wherein the layer comprises an oxide material.

14. The apparatus as claimed in claim 13, wherein the oxide material comprises one of silicon dioxide ($SiO_2$), borosilicate glass (BSG), or phosphosilicate glass (PSG).

15. The apparatus as claimed in claim 6, wherein the second surface of the layer has a root-mean-square (RMS) variation in height of approximately 0.1 Å to approximately 10.0 Å.

16. The apparatus as claimed in claim 1, wherein the piezoelectric layer has a direct current (DC) electrical resistivity at room temperature greater than approximately $10^{12}$ Ω-cm and less than approximately $10^{15}$ Ω-cm.

17. A surface acoustic wave (SAW) filter comprising a plurality of SAW resonator structures, one or more of the plurality of SAW resonator structures comprising:
a silicon (Si) substrate having a first surface and a second surface, the silicon substrate having a resistivity at room temperature that is greater than approximately 1000 Ω-cm and less than approximately 15000 Ω-cm; and
a piezoelectric layer disposed over the silicon substrate and having a first surface and a second surface wherein the piezoelectric layer has an optical absorptivity of greater than approximately 0.1 $cm^{-1}$ to less than approximately 1.0 $cm^{-1}$ at an optical wavelength of approximately 500 nm.

18. The SAW filter as claimed in claim 17, wherein the piezoelectric layer has a direct current (DC) electrical resistivity at room temperature greater than approximately $10^{12}$ Ω-cm and less than approximately $10^{15}$ Ω-cm.

19. The SAW filter of claim 17, wherein the piezoelectric layer comprises lithium niobate ($LiNbO_3$) or lithium tantalate ($LiTaO_3$).

20. The SAW filter of claim 17, wherein the piezoelectric layer has a thickness in a range of approximately 0.5 μm to approximately 30.0 μm.

21. The SAW filter of claim 20, wherein the piezoelectric layer is substantially without iron (Fe).

22. The SAW filter of claim 17, further comprising:
a plurality of electrodes disposed over the first surface of the piezoelectric layer, the plurality of electrodes configured to generate surface acoustic waves in the piezoelectric layer.

23. The SAW filter as claimed in claim 22, further comprising:
a layer disposed between the first surface of the silicon substrate and the second surface of the piezoelectric layer, the layer having a first surface and a second surface, the second surface of the layer having a smoothness sufficient to foster atomic bonding between the second surface of the layer and the first surface of the silicon substrate, or the first surface of the layer having a smoothness sufficient to foster atomic bonding between the first surface of the layer and the second surface of the piezoelectric layer; and
a plurality of features on the second surface of the piezoelectric layer, or on the first surface of the silicon substrate, the plurality of features configured to reflect acoustic waves and reduce an incidence of spurious modes in the piezoelectric layer.

24. The SAW filter as claimed in claim 23, wherein the reflected acoustic waves destructively interfere with acoustic waves in the piezoelectric layer.

25. The SAW filter as claimed in claim 23, wherein at least some of the plurality of features have substantially slanted sides.

26. The SAW filter as claimed in claim 23, wherein at least some of the plurality of features are substantially not in a regular pattern.

27. An apparatus, comprising:
a silicon (Si) substrate having a first surface and a second surface, wherein the silicon substrate has a resistivity at room temperature greater than approximately 1000 Ω-cm, and less than approximately 15000 Ω-cm; and
a piezoelectric layer comprising lithium niobate ($LiNbO_3$) or lithium tantalate ($LiTaO_3$), the piezoelectric layer being disposed over the silicon substrate and having a first surface and a second surface, the piezoelectric layer having an optical absorptivity of greater than approximately 0.1 $cm^{-1}$ to less than approximately 1.0 $cm^{-1}$ at an optical wavelength op approximately 500 nm, wherein the piezoelectric layer does not comprise oxygen dopants.

28. The apparatus of claim 27, wherein the piezoelectric layer is substantially without iron (Fe).

29. The apparatus of claim 27, further comprising:
a plurality of electrodes disposed over the first surface of the piezoelectric layer, the plurality of electrodes configured to generate surface acoustic waves in the piezoelectric layer.

30. The apparatus as claimed in claim 29, further comprising:
a layer disposed between the first surface of the silicon substrate and the second surface of the piezoelectric layer, the layer having a first surface and a second surface, either the second surface of the layer having a smoothness sufficient to foster atomic bonding between the second surface of the layer and the first surface of the silicon substrate, or the first surface of the layer having a smoothness sufficient to foster atomic bonding between the first surface of the layer and the second surface of the piezoelectric layer; and
a plurality of features on the second surface of the piezoelectric layer, or on the first surface of the silicon substrate, the plurality of features configured to reflect acoustic waves and reduce an incidence of spurious modes in the piezoelectric layer.

31. The apparatus as claimed in claim 30, wherein the reflected acoustic waves destructively interfere with acoustic waves in the piezoelectric layer.

32. The apparatus as claimed in claim 30, wherein at least some of the plurality of features have substantially slanted sides.

33. The apparatus as claimed in claim 32, wherein the at least some of the plurality of features have a height in a range of approximately 0.25 μm to approximately 1.5 μm.

34. The apparatus as claimed in claim 32, wherein the at least some of the plurality of features have a height in a range of approximately 0.1 μm to approximately 2.50 μm.

35. The apparatus as claimed in claim 30, wherein at least some of the plurality of features are substantially not in a regular pattern.

36. The apparatus as claimed in claim 30, wherein the at least some of the plurality of features have a height of approximately one-fourth of a wavelength (¼λ) of a spurious mode.

37. The apparatus as claimed in claim 30, wherein the layer comprises an oxide material.

38. The apparatus as claimed in claim 37, wherein the oxide material comprises one of silicon dioxide ($SiO_2$), borosilicate glass (BSG), or phosphosilicate glass (PSG).

39. The apparatus as claimed in claim 30, wherein the second surface of the layer has a root-mean-square (RMS) variation in height of approximately 0.1 Å to approximately 10.0 Å.

40. The apparatus as claimed in claim 27, wherein the piezoelectric layer has a direct current (DC) electrical resistivity at room temperature greater than approximately $10^{12}$ Ω-cm and less than approximately $10^{15}$ Ω-cm.

41. An apparatus, comprising:
a silicon (Si) substrate having a first surface and a second surface, wherein the silicon substrate has a resistivity at room temperature greater than approximately 1000 Ω-cm, and less than approximately 15000 Ω-cm;
a piezoelectric layer comprising lithium niobate ($LiNbO_3$) or lithium tantalate ($LiTaO_3$), the piezoelectric layer being disposed over the silicon substrate and having a first surface and a second surface, wherein the piezoelectric layer does not comprise oxygen dopants;
a plurality of electrodes disposed over the first surface of the piezoelectric layer, the plurality of electrodes configured to generate surface acoustic waves in the piezoelectric layer;
a layer disposed between the first surface of the silicon substrate and the second surface of the piezoelectric layer, the layer having a first surface and a second surface, either the second surface of the layer having a smoothness sufficient to foster atomic bonding between the second surface of the layer and the first surface of the silicon substrate, or the first surface of the layer having a smoothness sufficient to foster atomic bonding between the first surface of the layer and the second surface of the piezoelectric layer; and
a plurality of features on the second surface of the piezoelectric layer, or on the first surface of the silicon substrate, the plurality of features configured to reflect acoustic waves and reduce an incidence of spurious modes in the piezoelectric layer.

* * * * *